US007725860B1

(12) United States Patent
Kwong et al.

(10) Patent No.: US 7,725,860 B1
(45) Date of Patent: May 25, 2010

(54) CONTACT MAPPING USING CHANNEL ROUTING

(76) Inventors: Herman Kwong, 15 Hewitt Way, Kanata, ON (CA) K2L 3S2; Kah Ming Soh, 100 Hansen Avenue, Kanata, ON (CA) K2K 2M2; Martin Handforth, 42 Tiffany Crescent, Kanata, ON (CA) K2K 1W2; Larry Marcanti, 16 Monroe Ct., Allen, TX (US) 75002

( * ) Notice: Subject to any disclaimer, the term of this patent is extended or adjusted under 35 U.S.C. 154(b) by 1402 days.

(21) Appl. No.: 10/728,894

(22) Filed: Dec. 8, 2003

Related U.S. Application Data

(63) Continuation-in-part of application No. 10/101,211, filed on Mar. 20, 2002, which is a continuation-in-part of application No. 09/651,188, filed on Aug. 30, 2000, now Pat. No. 6,388,890, application No. 10/728,894, which is a continuation-in-part of application No. 10/326,123, filed on Dec. 23, 2002, which is a continuation-in-part of application No. 10/101,211, and a continuation-in-part of application No. 10/126,700, filed on Apr. 22, 2002, now Pat. No. 6,545,876, which is a continuation-in-part of application No. 09/651,188, application No. 10/728,894, which is a continuation-in-part of application No. 10/326,079, filed on Dec. 23, 2002, which is a continuation-in-part of application No. 10/126,700, and a continuation-in-part of application No. 10/101,211, application No. 10/728,894, which is a continuation-in-part of application No. 10/407,460, filed on Apr. 7, 2003, which is a continuation-in-part of application No. 10/126,700, and a continuation-in-part of application No. 10/101,211, and a continuation-in-part of application No. 10/326,123, and a continuation-in-part of application No. 10/326,079.

(60) Provisional application No. 60/475,880, filed on Jun. 5, 2003, provisional application No. 60/212,387, filed on Jun. 19, 2000.

(51) Int. Cl.
*G06F 17/50* (2006.01)
*H05K 3/02* (2006.01)
(52) U.S. Cl. .............................. 716/12; 716/1; 716/14; 716/16; 716/17; 29/846; 29/847
(58) Field of Classification Search ................... 716/4, 716/7, 10, 12, 16, 17; 717/168, 124; 714/739, 714/726; 712/37, 1; 710/315; 703/14; 361/780, 361/777; 174/260, 255
See application file for complete search history.

(56) References Cited

U.S. PATENT DOCUMENTS 5,006,820 A    4/1991  Prioste et al.

(Continued)

FOREIGN PATENT DOCUMENTS

DE           19922186 C1  *  10/2000

OTHER PUBLICATIONS

Sung-Chuan Fang et al., "Via minimization with associated constraints in three-layer routing problem", May 1-3, 1990, Circuits and Systems, IEEE International Symposium on, pp. 1632-1635 vol. 2.*

(Continued)

*Primary Examiner*—Helen Rossoshek
(74) *Attorney, Agent, or Firm*—Hunton & Williams LLP

(57) ABSTRACT

A technique for improved mapping of the contacts of a PLD to the contacts of one or more other electronic components are provided. In one particular exemplary embodiment, the technique may be realized as a method for mapping contacts of a programmable logic device (PLD) to an electronic component in a signal routing device having one or more layers. The method comprises assigning a set of one or more contacts of the PLD to one or more respective contacts of the electronic component based at least in part on a pattern of electrically conductive traces routed from respective contacts of the electronic component via one or more channels formed at one or more layers of the signal routing device.

17 Claims, 7 Drawing Sheets

U.S. PATENT DOCUMENTS

| | | | |
|---|---|---|---|
| 5,281,151 A | | 1/1994 | Arima et al. |
| 5,436,480 A * | | 7/1995 | Yu .............................. 257/321 |
| 5,451,721 A | | 9/1995 | Tsukada et al. |
| 5,511,306 A * | | 4/1996 | Denton et al. ................. 29/840 |
| 5,544,018 A | | 8/1996 | Sommerfeldt et al. |
| 5,596,587 A * | | 1/1997 | Douglas et al. ............. 714/739 |
| 5,598,343 A * | | 1/1997 | Roy et al. ..................... 716/16 |
| 5,603,043 A * | | 2/1997 | Taylor et al. .................... 712/1 |
| 5,622,770 A * | | 4/1997 | Dowdy et al. ............... 428/209 |
| 5,640,327 A * | | 6/1997 | Ting .............................. 716/7 |
| 5,686,764 A | | 11/1997 | Fulcher |
| 5,761,484 A * | | 6/1998 | Agarwal et al. ............... 716/16 |
| 5,777,887 A * | | 7/1998 | Marple et al. ................... 716/4 |
| 5,822,214 A * | | 10/1998 | Rostoker et al. ............. 716/10 |
| 5,850,537 A * | | 12/1998 | Selvidge et al. ............... 716/12 |
| 5,857,109 A * | | 1/1999 | Taylor .......................... 712/37 |
| 5,877,942 A * | | 3/1999 | Kida et al. .................. 361/777 |
| 6,184,713 B1 * | | 2/2001 | Agrawal et al. ............... 326/41 |
| 6,194,668 B1 | | 2/2001 | Horiuchi et al. |
| 6,198,635 B1 | | 3/2001 | Shenoy et al. |
| 6,216,257 B1 * | | 4/2001 | Agrawal et al. ............... 716/16 |
| 6,266,342 B1 * | | 7/2001 | Stacey et al. ................. 370/465 |
| 6,271,478 B1 | | 8/2001 | Horiuchi et al. |
| 6,292,930 B1 * | | 9/2001 | Agrawal et al. ............... 716/16 |
| 6,310,398 B1 | | 10/2001 | Katz |
| 6,335,493 B1 | | 1/2002 | Horiuchi et al. |
| 6,336,209 B1 * | | 1/2002 | Nishihara et al. ............. 716/17 |
| 6,351,814 B1 * | | 2/2002 | Batinic et al. ............... 713/194 |
| 6,388,890 B1 | | 5/2002 | Kwong et al. |
| 6,407,343 B1 | | 6/2002 | Tanaka |
| 6,452,262 B1 | | 9/2002 | Juneja |
| 6,481,001 B1 * | | 11/2002 | Moore ......................... 716/18 |
| 6,521,846 B1 | | 2/2003 | Freda et al. |
| 6,526,558 B2 * | | 2/2003 | Agrawal et al. ............... 716/16 |
| 6,541,147 B1 * | | 4/2003 | McLean et al. ............... 429/35 |
| 6,545,876 B1 | | 4/2003 | Kwong et al. |
| 6,604,230 B1 * | | 8/2003 | Khalid et al. ................. 716/16 |
| 6,629,308 B1 * | | 9/2003 | Baxter .......................... 716/16 |
| 6,631,510 B1 * | | 10/2003 | Betz et al. ..................... 716/16 |
| 6,654,941 B1 * | | 11/2003 | Baumbach ................... 716/10 |
| 6,681,353 B1 * | | 1/2004 | Barrow ........................ 714/725 |
| 6,700,404 B1 * | | 3/2004 | Feng et al. ..................... 326/41 |
| 6,785,873 B1 * | | 8/2004 | Tseng ............................ 716/4 |
| 6,810,513 B1 * | | 10/2004 | Vest ............................. 716/16 |
| 6,888,371 B2 * | | 5/2005 | Wong .......................... 326/38 |
| 6,911,835 B2 * | | 6/2005 | Chraft et al. ................. 324/754 |
| 6,915,466 B2 * | | 7/2005 | Mastro et al. ............... 714/712 |
| 6,968,487 B1 * | | 11/2005 | Bryant et al. ............... 714/726 |
| 7,024,660 B2 * | | 4/2006 | Andrade et al. ............. 717/124 |
| 7,051,309 B1 * | | 5/2006 | Crosetto ...................... 716/10 |
| 7,107,673 B2 * | | 9/2006 | Kwong et al. ................. 29/832 |
| 7,281,326 B1 * | | 10/2007 | Kwong et al. ................. 29/852 |
| 7,398,437 B2 * | | 7/2008 | Mastro et al. ............... 714/712 |
| 2001/0009032 A1 * | | 7/2001 | Mohsen ....................... 716/15 |
| 2002/0060372 A1 * | | 5/2002 | Muff et al. ................... 257/786 |
| 2002/0069396 A1 * | | 6/2002 | Bhattacharya et al. ......... 716/7 |
| 2003/0078752 A1 * | | 4/2003 | Allamsett ................... 702/120 |
| 2004/0099440 A1 * | | 5/2004 | Kwong et al. ............... 174/260 |
| 2004/0158804 A1 * | | 8/2004 | Hayles ........................... 716/6 |
| 2004/0212103 A1 * | | 10/2004 | Kwong et al. ............... 257/786 |
| 2005/0102125 A1 * | | 5/2005 | Tseng .......................... 703/14 |
| 2006/0015862 A1 * | | 1/2006 | Odom et al. ................. 717/168 |
| 2006/0259889 A1 * | | 11/2006 | Crosetto ...................... 716/10 |

OTHER PUBLICATIONS

Stallmann et al., "Unconstrained via minimization for topological multilayer routing", Sep. 1990, Computer-Aided Design of Integrated Circuits and Systems, IEEE Transactions on, vol. 9, Issue 9, pp. 970-980.*

* cited by examiner

CONTACT MAPPING USING CHANNEL ROUTING

CROSS-REFERENCE TO RELATED APPLICATIONS

This patent application claims priority to U.S. Provisional Patent Application No. 60/475,880, filed Jun. 5, 2003, which is hereby incorporated by reference herein in its entirety.

This patent application is a continuation-in-part patent application of U.S. patent application Ser. No. 10/101,211, filed Mar. 20, 2002, which is a continuation-in-part patent application of U.S. patent application Ser. No. 09/651,188, filed Aug. 30, 2000, now U.S. Pat. No. 6,388,890, which claims priority to U.S. Provisional Patent Application No. 60/212,387, filed Jun. 19, 2000, all of which are hereby incorporated by reference herein in their entirety.

This patent application is also a continuation-in-part patent application of U.S. patent application Ser. No. 10/326,123, filed Dec. 23, 2002, which is a continuation-in-part patent application of the above-referenced U.S. patent application Ser. No. 10/101,211, and a continuation-in-part patent application of U.S. patent application Ser. No. 10/126,700, filed Apr. 22, 2002, now U.S. Pat. No. 6,545,876, which is a continuation of the above-referenced U.S. patent application Ser. No. 09/651,188, all of which are hereby incorporated by reference herein in their entirety.

This patent application is also a continuation-in-part patent application of U.S. patent application Ser. No. 10/326,079, filed Dec. 23, 2002, which is a continuation-in-part patent application of the above-referenced U.S. patent application Ser. No. 10/126,700, and a continuation-in-part patent application of the above-referenced U.S. patent application Ser. No. 10/101,211, all of which are hereby incorporated by reference herein in their entirety.

This patent application is also a continuation-in-part patent application of U.S. patent application Ser. No. 10/407,460, filed Apr. 7, 2003, which is a continuation-in-part patent application of the above-referenced U.S. patent application Ser. No. 10/126,700, a continuation-in-part application of the above-referenced U.S. patent application Ser. No. 10/101,211, a continuation-in-part patent application of the above-referenced U.S. patent application Ser. No. 10/326,123, and a continuation-in-part patent application of U.S. patent application Ser. No. 10/326,079, all of which are hereby incorporated by reference herein in their entirety.

FIELD OF THE INVENTION

The present invention relates generally to multilayer signal routing devices and, more particularly, to a technique for mapping contacts of a programmable logic device to another electronic component.

BACKGROUND OF THE INVENTION

Increasing capability and functionality, as well as falling prices, have driven electronic designers to use programmable logic devices (PLDs) in a wide variety of designs. Examples of PLDs commonly used include field programmable gate array (FPGA) devices, complex programmable logic devices (CPLDs), application specific integrated circuits (ASICs), and the like.

In many circuit designs, PLDs are implemented to communicate signals to and/or receive signals from other electronic components. Accordingly, the logic of the PLDs may be programmed so that certain contacts of the PLD are "assigned" to corresponding contacts of an electronic component such that the assigned contact receives signals from and/or provides signals to the corresponding contact of the electronic component via a conductive trace routed between the contact of the PLD and the contact of the electronic component.

Conventionally, the contact assignments (i.e., "pin assignments") of electronic components differ by vendor. As a result, electronic systems implementing common electronic components typically are designed to maximize the footprint density of the electronic component as opposed to providing for the optimum breakout of the contacts of the electronic components. This emphasis on footprint density to the detriment of optimum breakout efficiency may not be perceived as a serious concern in low-contact-count component designs as the contact mapping between components typically is relatively simple. However, with the advent of high-density, multiple layer designs, inefficient mapping of contacts of PLDs to other electronic components, such as application specific integrated circuits (ASICs), has serious ramifications for the effective design and operation of such complex designs.

In view of the foregoing, it would be desirable to provide a technique that provides improved contact mapping of the contacts of a PLD to one or more other electronic components.

SUMMARY OF THE INVENTION

According to the present invention, a technique for improved contact mapping of the contacts of a PLD to one or more other electronic components. In one embodiment, the technique may be realized as a method for mapping contacts of a programmable logic device (PLD) to an electronic component in a signal routing device having one or more layers. The method comprises assigning a set of one or more contacts of the PLD to one or more respective contacts of the electronic component based at least in part on a pattern of electrically conductive traces routed from respective contacts of the electronic component via one or more channels formed at one or more layers of the signal routing device.

In another embodiment, the technique may be realized as a method for optimizing a mapping of contacts of a programmable logic device (PLD) to contacts of an electronic component in a signal routing device having one or more layers. The method comprises determining a first pattern of electrically conductive traces routed from respective contacts of the electronic component via one or more channels formed at one or more layers of the signal routing device, determining a first contact assignment pattern for one or more contacts of the PLD based at least in part on the first pattern of electrically conductive traces, refining the first pattern of electrically conductive traces based at least in part on the first contact assignment pattern to generate a second pattern of electrically conductive traces routed from the respective contacts of the electronic component via one or more channels formed at one or more layers of the signal routing device, and determining a second contact assignment pattern for one or more contacts of the PLD based at least in part on the second pattern of electrically conductive traces.

In yet another embodiment, the technique may be realized as a signal routing device having one or more layers. The signal routing device comprises an electronic component having a plurality of contacts, a programmable logic device (PLD) having a plurality of contacts, and a plurality of electrically conductive traces connecting contacts of the PLD to respective contacts of the electronic component, the plurality of electrically conductive traces routed from the respective contacts of the electronic component via one or more channels formed at one or more layers of the signal routing device, wherein the one or more contacts of the PLD are assigned based at least in part on a pattern formed by the electrically conductive traces routed from the respective contacts of the electronic component via the one or more channels.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENT(S)

At the outset, it is helpful to refer to the microvia-based techniques for reducing the number of layers in a multilayer signal routing device and the power/ground-based techniques for reducing the number of layers in a multilayer signal routing device as have been substantially described in the above-referenced U.S. Provisional Patent Application No. 60/212, 387, the above-referenced U.S. patent application Ser. No. 09/651,188, now U.S. Pat. No. 6,388,890, the above-referenced U.S. patent application Ser. No. 10/101,211, the above-referenced U.S. patent application Ser. No. 10/126,700, now U.S. Pat. No. 6,545,876, the above-referenced U.S. patent application Ser. No. 10/326,123, the above-referenced U.S. patent application Ser. No. 10/326,079, and the above-referenced U.S. patent application Ser. No. 10/407,460, all of which have been incorporated by reference herein in their entirety. The above-referenced techniques may be used beneficially in conjunction with one or more of the techniques described herein. It should be noted, however, that the techniques described herein may also be used separately to effectively map the contacts of a PLD to another electronic component.

The term contact may refer to any of a variety of conductive structures (e.g., "leads") used to provide an electrical connection to an input/output of an electronic component. Examples of contacts may include, but are not limited to, pins, balls, columns, etc.

Figure 1:
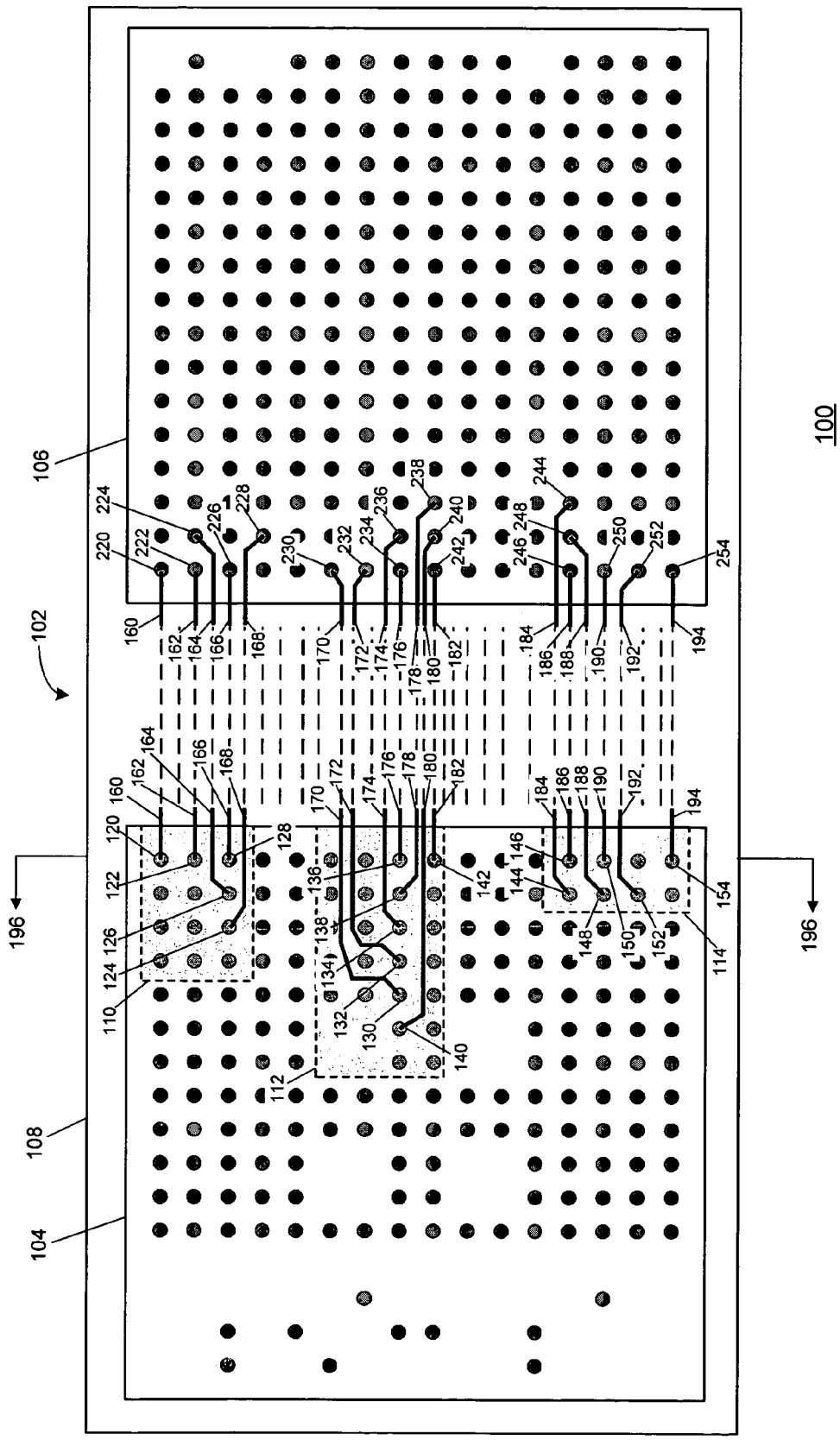
FIG. 1 is a transparent view of an exemplary multilayer signal routing device having a programmable logic device mapped to an electronic component in accordance with at least one embodiment of the present invention.
Figure 2:
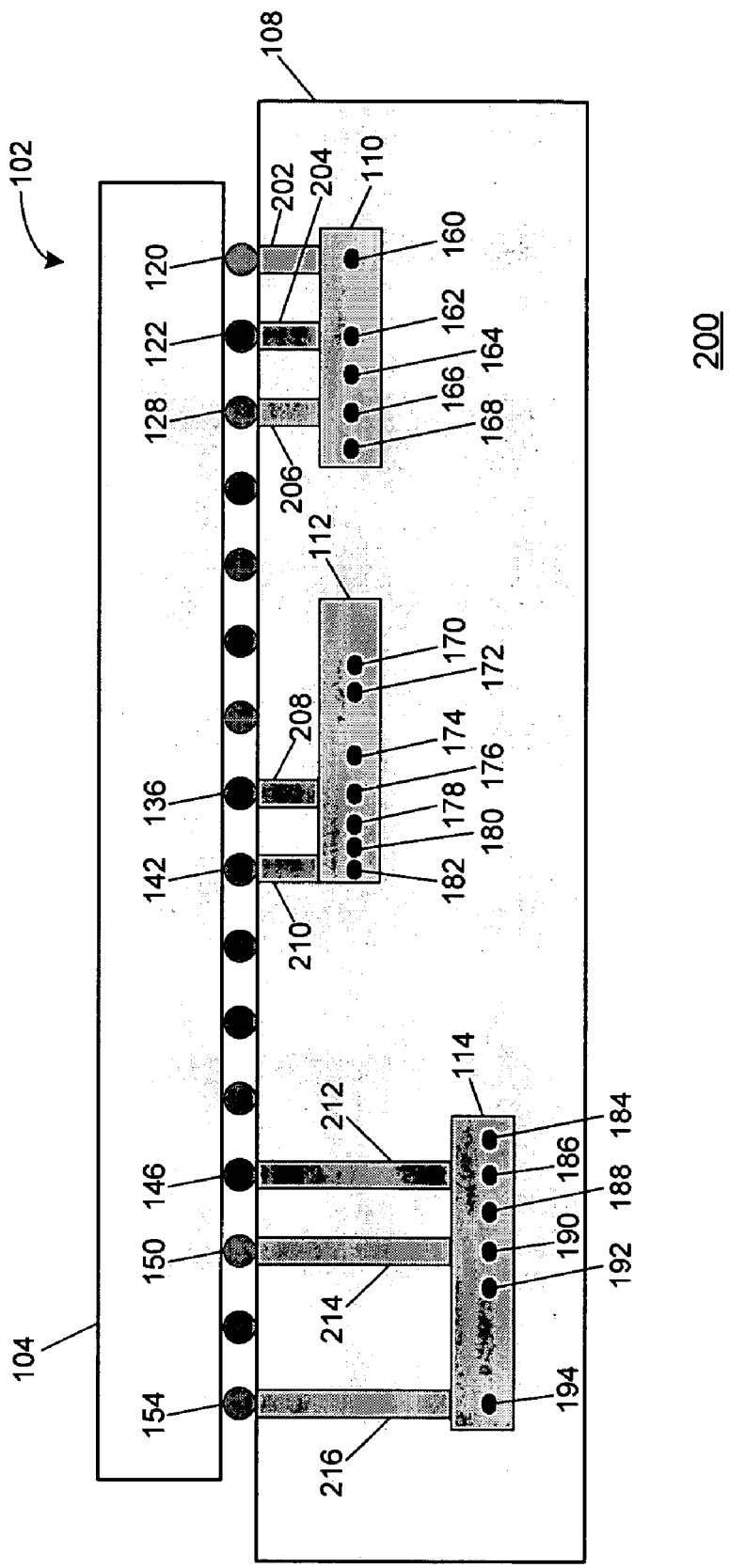
FIG. 2 is a side cross-sectional view of the exemplary multilayer signal routing device of FIG. 1 in accordance with at least one embodiment of the present invention.

Referring now to FIGS. 1 and 2, an exemplary technique for mapping the contacts of a PLD to another electronic component using channel routing is illustrated in accordance with at least one embodiment of the present invention.

FIG. 1 illustrates a transparent view 100 of an exemplary multilayer signal routing device 102 having an electronic component 104 and programmable logic device (PLD) 106 mounted on a multilayer substrate 108. The transparent view 100 illustrates various layers of the signal routing device 102 including the footprints of the electronic component 104 and PLD 106 at the surface of the substrate 108 as well as illustrating features of other layers of the substrate 108.

The electronic component 104 may include any of a variety of electronic components having a fixed, or predetermined, contact assignments, including, for example, an application specific integrated circuit (ASIC), a microprocessor, and other complex logical devices. The PLD 106 may include any of a variety of electronic components programmable to achieve a desired contact assignment including, for example, a FPGA device, a CPLD, and the like.

In at least one embodiment, the multilayer signal routing device 102 is designed so that one or more signals are communicated between one or more contacts of the electronic component 104 and one or more contacts of the PLD 106 using electrically conductive traces formed to connect the respective contacts.

For at least the purpose of reducing the number of layers of the substrate 108 needed to route signals in the signal routing device 102, in at least one embodiment, various channel routing techniques may be employed to form one or more channels in one or more layers of the substrate 108 beneath the relevant contacts of the electronic component 104.

An exemplary channel routing technique that may be utilized is described in the above-referenced U.S. Pat. No. 6,388, 890 issued on May 14, 2002 to Kwong et al. Kwong et al. disclose a technique for manufacturing and using a printed circuit board (PCB) wherein certain vias extend only through a subset of the layers of the PCB to create channels in the portions of the PCB where vias are absent. These channels then may be used to route a larger number of signal, power, ground and/or test traces between vias thereby reducing the number of layers necessary to provide a certain number of electrical connections.

After forming the appropriate channels in the substrate 108, the relevant contacts of the electronic component 104 may be "broken out" to the side of the electronic component 104 by determining a pattern of electrically conductive traces routed from the contacts to the side of the electronic component 104 via the channels formed in the substrate 108. This pattern of conductive traces formed to breakout a set of contacts is referred to herein as a "breakout pattern."

To illustrate, assume, for example, that the multilayer signal routing device 102 is designed such that contacts 120-154 of the electronic component 104 communicate signals to and/or receive signals from corresponding contacts of the PLD 106. Accordingly, a channel formed at region 110 (herein referred to as "channel 110") may be used to route conductive traces 160-168 from contacts 122-128, respectively, to the side of the electronic component 104. Similarly, a channel formed at region 112 (herein referred to as "channel 112") may be used to route conductive traces 170-182 from contacts 130-142, respectively, to the side of the electronic component 104. A channel formed at region 114 (herein referred to as "channel 114") may be used to route conductive traces 184-194 from contacts 144-154, respectively, to the side of the electronic component 104. The routing of the conductive traces 160-194 therefore forms a particular breakout pattern in relation to the electronic component 104.

Referring to FIG. 2, an enlarged side cross-section view 200 of the multilayer signal routing device 102 at cross section 196 (FIG. 1) is illustrated in accordance with at least one embodiment of the present invention. In the illustrated example, the channels 110 and 112 are formed at one layer of the substrate 108 and the channel 114 is formed at another layer of the substrate 108. As discussed above, the channels 110, 112 and 114 may be formed, for example, by using microvias to provide conductive paths between the contacts of the electronic component 104 and one or more layers of the substrate 108 such that the microvias do not extend into various sections of various layers of the substrates. These sections then may be used as channels to route conductive traces.

In the illustrated embodiment, channel 110 is used to route conductive traces 160-168, which are used to breakout contacts 120-128. Channel 112 is used to route conductive traces 170-182, which are used to breakout contacts 130-142, respectively. Channel 114 is used to route conductive traces 184-194, which are used to breakout contacts 144-154, respectively.

Assigned contacts of the electronic component 104 may be electrically connected to the corresponding conductive trace by, for example, forming a microvia between the contact and the breakout trace in the channel to provide a conductive path between the contact and the conductive trace. To illustrate, contacts 120, 122, 128, 136, 142, 146, 150 and 154 may be electrically connected to the corresponding conductive trace 160, 162, 168, 176, 182, 186, 190 and 194 by forming microvias 202-216, respectively, between the contact and the corresponding channel.

Referring again to FIG. 1, it will be appreciated that the mapping of contacts of the PLD 106 to the contacts of the electronic component 104 preferably is conducted so as to minimize or eliminate the cross-over of conductive traces as they connect a contact of the electronic component 104 to a contact of the PLD 106. Accordingly, in at least one embodiment, the PLD 106 is programmed based at least in part on the breakout pattern of the conductive traces 160-196 so that the contact assignment of the PLD 106 minimizes or eliminates the crossover of conductive traces connecting contacts 120-154 to respective contacts of the PLD 106.

In at least one embodiment, optimal contact mapping may be achieved at least in part by programming the PLD 106 such that for a given conductive trace breaking out a contact of the electronic component 104, a contact of the PLD 106 across from or along a direct path from the conductive trace is assigned to the conductive trace. To illustrate, assuming that the electronic component 104 and the PLD 106 are located side-by-side as depicted in FIG. 1, contact 202 is directly across from the conductive trace 160 and therefore may be assigned for connection to the conductive trace 160. In a similar manner, contacts 222, 226, 230, 232, 234, 242, 246 and 250-254 may be assigned for connection to contacts 122, 126, 130, 132, 134, 142, 146 and 150-154, respectively, via conductive traces 162, 166, 170, 172, 174, 182, 186, and 190-194, respectively.

In certain implementations, however, the number of connections between contacts of the electronic component 104 and the PLD 106, in combination with the layout of the contacts of the PLD 106, may have the result that there are more conductive traces leading from the contacts of the electronic component 104 than there are contacts on the nearest edge of the PLD 106. Accordingly, in at least one embodiment, interior contacts of the PLD 106 (i.e., those contacts not immediately adjacent to the edge of the PLD 106, may be assigned to connect with a contact of the electronic component 104. For example, contacts 224, 228, 236-240, 244 and 248 of the PLD 106 may be assigned to connect to contacts 124, 128, 136-140, 144 and 148, respectively, of the electronic component 104 via conductive traces 164, 168, 176-180 and 184, respectively. In the illustrated embodiment of FIG. 1, the conductive traces 264, 268, 276-280 and 284 are formed from the edge of the PLD 106 to the respective pin using a non-channel routing technique. However, as discussed in greater detail with reference to FIG. 3, in other embodiments, channel routing may be implemented to route conductive traces from the edge of the PLD 106 to the contacts of the PLD 106.

As demonstrated in FIG. 1, the assignment of contacts of the PLD 106 to take into account the breakout pattern used to breakout contacts of the electronic component 104 (using channel routing) reduces the number of conductive traces that cross-over between the electronic component 104 and the PLD 106 and therefore reduces the potential for degradation of the signals resulting from via parasitics and reduces the number of layers of the substrate 108 necessary for signal routing.

Figure 3:
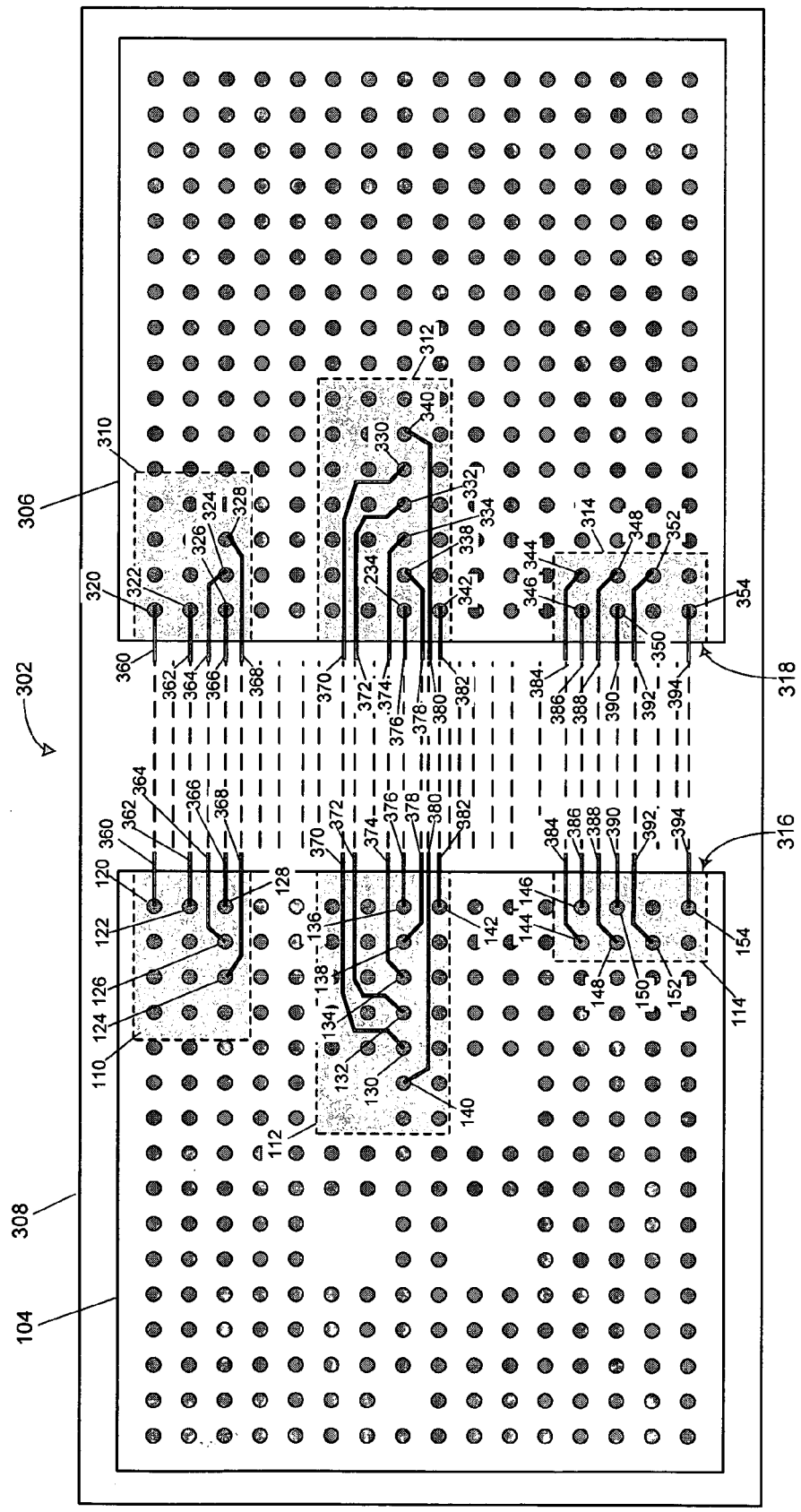
FIG. 3 is a transparent view of an exemplary multilayer signal routing device including an electronic component and a programmable logic device having mirrored breakout patterns in accordance with at least one embodiment of the present invention.

Referring now to FIG. 3, a transparent view 300 of an exemplary multilayer signal routing device 302 is illustrated in accordance with the present invention. The multilayer signal routing device 302 includes the electronic component 104 and a PLD 306 (analogous to PLD 106) mounted on a substrate 308. The transparent view 300 illustrates various layers of the signal routing device 302 including the footprints of the electronic component 104 and PLD 306 at the surface of the signal routing device 302 as well as illustrating features of other layers of the signal routing device 302.

One or more channels (e.g., channels 110-114) are formed in the substrate 308 to facilitate the breakout of the contacts 120-154 by routing conductive traces 160-194 from the contacts 120-154, respectively, to the edge of the electronic component 104 via the channels 110-114.

As discussed above, in one embodiment, the conductive traces 160-154 connecting the contacts of the electronic component 104 to the corresponding contacts of the PLD 306 may be routed from the edge of the PLD to the contacts of the PLD 306 using non-channel routing techniques. In other embodiments, however, one or more channels may be formed beneath the PLD 306 at one or more layers of the substrate 308. Like the channels 110-114 formed for the electronic component 104, channels may be formed at regions 310-314 (these channels are herein referred to as channels 310-314, respectively) and may be used to facilitate the routing of conductive traces to the contacts of the PLD 306.

To illustrate, channel 310 may be formed and used to route conductive channels 360-368 between contacts 120-128 of electronic component 104 and contacts 320-328 of the PLD 306. Channel 312 may be formed and used to route conductive channels 370-382 between contacts 130-142 of electronic component 104 and contacts 330-342 of the PLD 306. Channel 314 may be formed and used to route conductive channels 384-394 between contacts 144-154 of electronic component 104 and contacts 344-354 of the PLD 306.

In many instances, the contact layout of the electronic component 104 is substantially similar to the contact layout of the PLD 306. In such instances, the contact assignment pattern for the PLD 306, the channels formed for the PLD 306 and the routing of the conductive traces to the contacts of the PLD 306 may be arranged in a substantially mirror image of the channel/breakout trace arrangement of the electronic component 104. In other words, the breakout pattern for the electronic component 104 with respect to edge 316 of the electronic component 104 may be substantially symmetric to the breakout pattern for the PLD 306 with respect to edge 318 of the PLD 306.

Using a breakout pattern at the PLD 306 that is substantially similar to the breakout pattern for the electronic component 104 has a number of advantages. For one, the channels formed under the electronic component 104 may be extended under the PLD 306 so that conductive traces connecting contacts of the electronic component 104 to contacts of the PLD 306 may be routed between the electronic component 104 and the PLD 306 via a single continuous channel. Further, a mirror image breakout pattern typically simplifies the design of the multilayer signal routing device 302 as the breakout pattern used for the electronic component 104 may be repeated, in mirror image form, for the PLD 306. Moreover, by using the mirror image breakout patterns at the electronic component 104 and the PLD 306, cross-over of conductive traces connecting the contacts of the electronic component 104 and the PLD 306 typically is avoided.

Figure 4:
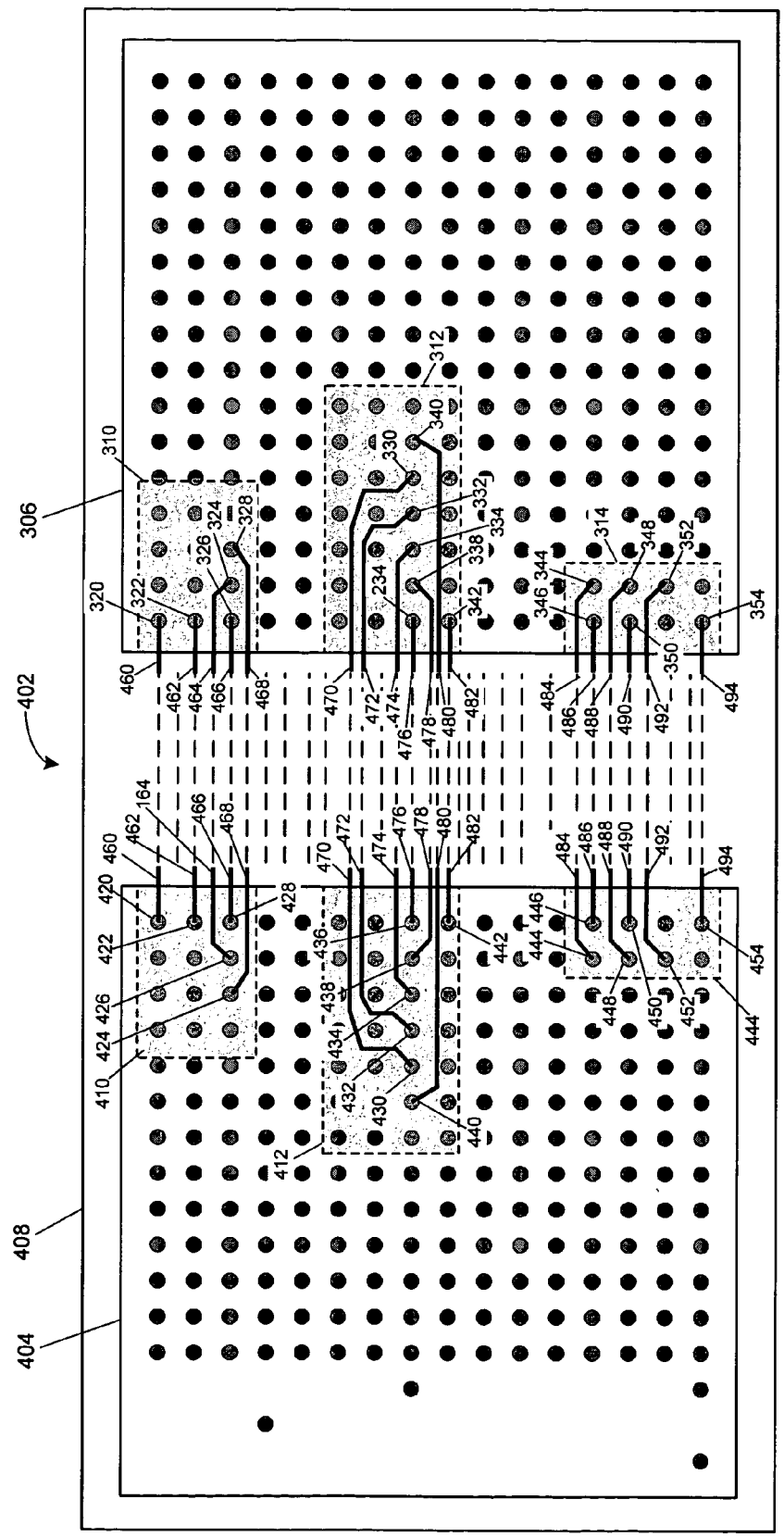
FIG. 4 is a transparent view of an exemplary signal routing device having two programmable logic devices mapped to each other in accordance with at least one embodiment of the present invention.

Referring now to FIG. 4, a transparent view 400 of an exemplary multilayer signal routing device 402 having PLDs 306 and 404 is illustrated in accordance with at least one embodiment of the present invention. The transparent view 400 illustrates various layers of the signal routing device 402 including the footprints of the PLDs 306 and 404 at the surface of the signal routing device 402 as well as illustrating features of other layers of the signal routing device 402.

As discussed above, in at least one embodiment, a PLD may be programmed so that its contact assignments correspond to the breakout pattern of an electronic component having fixed contact assignments (e.g., an ASIC). However, in other embodiments, the present invention provides a technique for mapping conductive traces between two or more PLDs.

In the illustrated embodiment, the PLDs 306 and 404 (analogous to PLD 106, FIG. 1) are mounted on a substrate 408, where the multilayer signal routing device 402 is designed so that one or more signals are communicated between the PLDs 306 and 404.

To facilitate the mapping of contacts between the PLDs 306 and 404, the PLDs 306 and 404 may be programmed to assign contacts based on each other's breakout pattern. In at least one embodiment, this mapping may be achieved by programming the PLDs 306 and 404 to have breakout patterns and contact assignments that are mirror images of each other, as discussed above with reference to FIG. 3. FIG. 4 illustrates an exemplary mirror image arrangement wherein the breakout pattern formed by routing conductive traces 460-494 from the contacts 320-354, respectively, via channels 310-314 mirrors the breakout pattern formed by routing the conductive traces 460-494 to the contacts 420-454 via channels formed at regions 410-414 (herein referred to as channels 410-414, respectively).

For ease of discussion, the exemplary implementations of FIGS. 1-4 have been illustrated using electronic components and PLDs having the same or similar footprint (i.e., having the same number and arrangement of contacts). However, the present invention may be beneficially used for routing signal traces between electronic components and PLDs regardless of whether their footprints are the same or similar. Accordingly, those skilled in the art may use the guidelines provided herein to implement the present invention in systems wherein the PLDs and electronic components have different footprints without departing from the spirit or the scope of the present invention.

Figure 5:
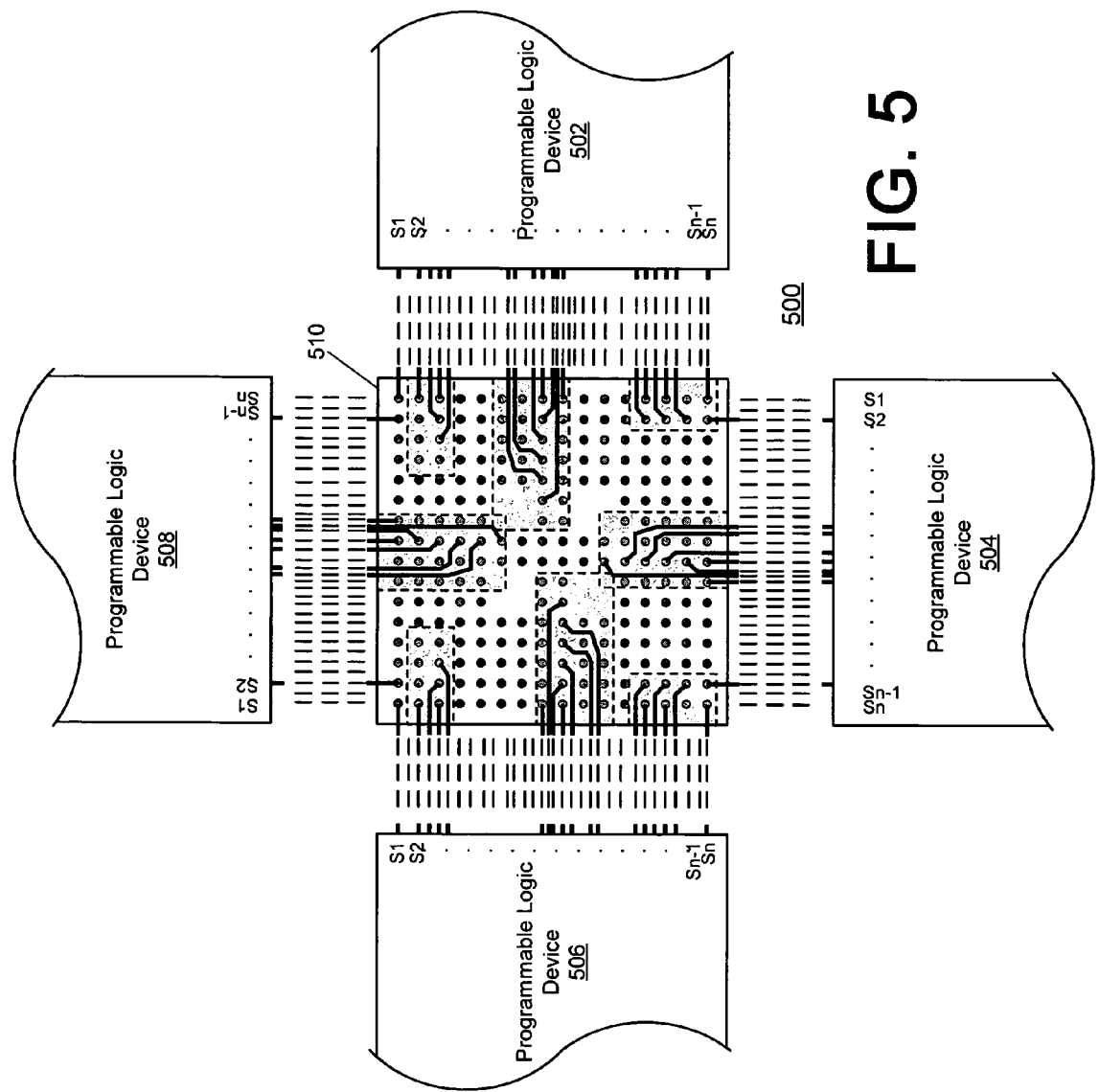
FIG. 5 is a transparent view of an exemplary signal routing device having a plurality of programmable logic devices mapped to an electronic component in accordance with at least one embodiment of the present invention.

Moreover, although FIGS. 1-4 illustrate exemplary implementations having a one-to-one correspondence between a PLD and another component having a fixed contact assignment, in other embodiments, multiple PLDs may be programmed to map to multiple breakout patterns of another electronic component. For example, FIG. 5 illustrates a transparent view 500 of exemplary arrangement whereby four PLDs 502-508 are programmed to have contact assignments corresponding to the breakout pattern for a respective side of an electronic component 510. The transparent view 500 illustrates the footprints of the electronic component 510 and PLDs 502-508 at the surface of a signal routing device as well as illustrating features of other layers of the signal routing device.

As illustrated, the electronic component 510 may utilize one or more channels to facilitate the breakout of the contacts of the electronic component 510. One or more of the PLDs 502-508 similarly may employ channel routing to route conductive traces to the assigned contacts.

In other embodiments, the PLD may be programmed such that its contact assignments correspond to the breakout patterns of multiple electronic components. For example, FIG. 6 illustrates a transparent view 600 of an exemplary arrangement whereby a PLD 602 may be programmed to assign its contacts based at least in part on the breakout patterns of the electronic components 604-610 arranged adjacently to respective sides of the PLD 602.

Figure 6:
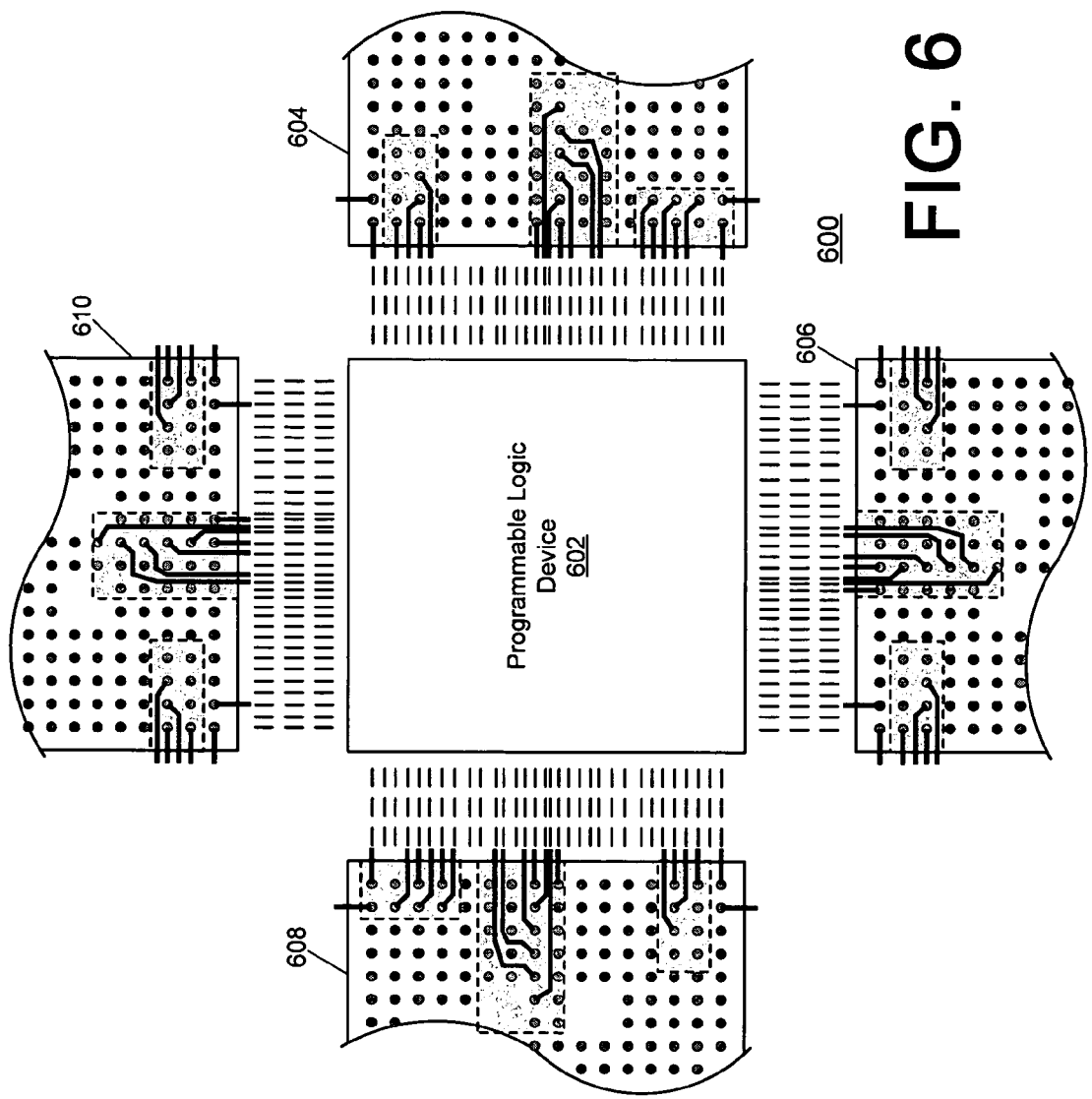
FIG. 6 is a transparent view of an exemplary signal routing device having a programmable logic device mapped to a plurality of electronic components in accordance with at least one embodiment of the present invention.

Although FIGS. 5 and 6 show exemplary arrangements having a 4:1 ratio of PLD to electronic component, or vice versa, those skilled in the art may utilize the teachings provided herein to provide PLD contact mapping for arrangements having lesser or greater ratios.

Figure 7:
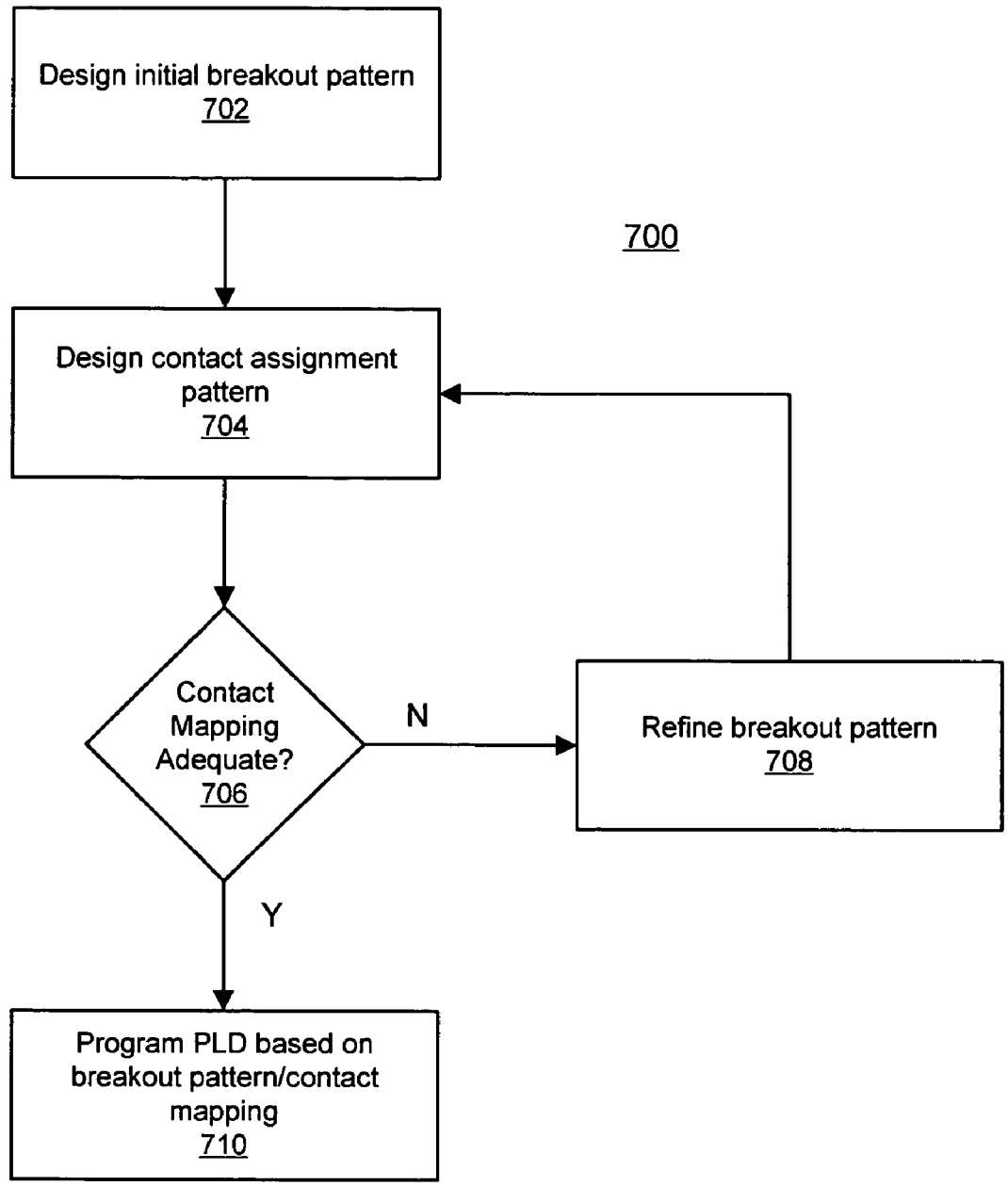
FIG. 7 is a flow diagram of an iterative contact mapping refinement process in accordance with at least one embodiment of the present invention.

Referring now to FIG. 7, an exemplary method for designing an optimal mapping of contacts of a PLD to contacts of an electronic component is illustrated.

In certain instances, it may be appropriate to design a breakout pattern of conductive traces for certain contacts of an electronic component and implement the designed breakout pattern in a signal routing device before considering the assignment of contacts in the PLD. In such instances, the programming of the PLD to achieve a contact assignment suitable to the already-implemented breakout pattern of the electronic component may result in an adequate, but not optimal, contact assignment mapping that cannot be further optimized because the breakout pattern for the electronic component has already been set. In other instances, however, it may be advantageous to implement a reiterative design process 700 whereby the breakout pattern of the electronic component and/or the contact assignment pattern of the PLD are refined to achieve a more optimal contact mapping (e.g., fewer conductive trace cross-overs and/or fewer substrate layers implemented).

The exemplary design process 700 initiates at step 702 whereby an initial breakout pattern of conductive traces for the relevant contacts of an electronic component (e.g., electronic component 104, FIG. 1) of a signal routing device is designed, but not yet implemented, using one or more channels formed in the substrate of the signal routing device to route the conductive traces.

At step 704, an initial contact assignment pattern for the contacts of the PLD (e.g., PLD 106, FIG. 1) is designed based at least in part on the initial breakout pattern. At step 706, the contact mapping resulting from the initial breakout pattern and the initial contact assignment pattern is analyzed to determine if the proposed contact mapping is adequate in view of one or more measurement criteria. The measurement criteria may include, for example, the frequency and/or magnitude of conductive trace cross-overs, the number of substrate layers necessary to implement the contact mapping, the length of the average trace, the area of the substrate, the number of percentage of input/output contacts successfully escaped, the relative degree of mirror symmetry, and the like.

If the contact mapping is determined to be inadequate in view of the measurement criteria at step 706, the breakout pattern may be refined at step 708. Refinement of the breakout pattern may include the use of additional or different channels to route the conductive traces of the breakout pattern, altering the routing of the conductive traces within the channels, minimizing the length of the conductive traces for handling high speed signals, adjusting the routing of traces within or outside of the channels to accommodate for though traffic routing from one side of the routing device to the other, and the like.

At step 704, a new or refined contact assignment pattern may be determined for the PLD based at least in part on the refined breakout pattern. At step 706, the refined contact mapping resulting from the refined contact assignment pattern and the refined breakout pattern is compared to the one or more measurement criteria at step 706. If the refined contact mapping is again found to be inadequate, steps 704-708 may be repeated until an adequate contact mapping is designed.

After determining an adequate contact mapping, the PLD may be programmed based on the resulting contact mapping pattern and implemented in the signal routing device at step 710.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. A method for mapping contacts of a programmable logic device (PLD) to contacts of an electronic component in a signal routing device having one or more layers, the method comprising:
   providing a contact pattern for the programmable logic device (PLD);
   determining a first pattern of electrically conductive traces routed from respective contacts of the electronic component via one or more channels formed at one or more layers of the signal routing device;
   determining a first contact assignment pattern for one or more contacts of the PLD based at least in part on the first pattern of electrically conductive traces;
   refining the first pattern of electrically conductive traces based at least in part on the first contact assignment pattern to generate a second pattern of electrically conductive traces routed from the respective contacts of the electronic component via one or more channels formed at one or more layers of the signal routing device; and
   assigning a set of one or more contacts of the PLD to one or more respective contacts of the electronic component based at least in part on the second pattern of electrically conductive traces routed from the respective contacts of the electronic component via one or more channels formed at one or more layers of the signal routing device;
   wherein the one or more channels are formed by arranging vias for contacts of at least the electronic component in the signal routing device.

2. The method as in claim 1, further comprising the step of forming electrically conductive traces between the set of one or more contacts of the PLD and the respective contacts of the electronic component in accordance with the second pattern of electrically conductive traces.

3. The method as in claim 2, wherein one or more of the electrically conductive traces are routed to respective contacts of the PLD via one or more channels formed at one or more layers of the signal routing device.

4. The method as in claim 1, wherein the set of one or more contacts of the PLD are electronically assigned to the one or more respective contacts of the electronic component based at least in part on the second pattern of electrically conductive traces.

5. The method as in claim 1, further comprising the step of:
   assigning one or more contacts of the PLD to one or more respective contacts of a second electronic component of the signal routing device based at least in part on a pattern of electrically conductive traces routed from respective contacts of the second electronic component via one or more channels formed at one or more layers of the signal routing device.

6. The method as in claim 1, further comprising the step of:
   assigning one or more contacts of a second PLD to one or more respective contacts of the electronic component based at least in part on a second pattern of electrically conductive traces routed from respective contacts of the electronic component via one or more channels formed at one or more layers of the signal routing device.

7. The method as in claim 1, wherein the set of one or more contacts of the PLD are assigned to the respective contacts of the electronic component by programming the PLD.

8. The method as in claim 1, wherein the electronic component includes one of a group consisting of: a programmable logic device (PLD) and an application specific integrated circuit (ASIC).

9. A method for mapping contacts of a programmable logic device (PLD) to contacts of an electronic component in a signal routing device having one or more layers, the method comprising:
   providing a contact pattern for the programmable logic device (PLD);
   determining a first pattern of electrically conductive traces routed from respective contacts of the electronic component via one or more channels formed at one or more layers of the signal routing device;

determining a first contact assignment pattern for one or more contacts of the PLD based at least in part on the first pattern of electrically conductive traces;

refining the first pattern of electrically conductive traces based at least in part on the first contact assignment pattern to generate a second pattern of electrically conductive traces routed from the respective contacts of the electronic component via one or more channels formed at one or more layers of the signal routing device; and determining a second contact assignment pattern for one or more contacts of the PLD based at least in part on the second pattern of electrically conductive traces;

wherein the one or more channels are formed by arranging vias for contacts of at least the electronic component in the signal routing device.

10. The method as in claim 9, further comprising the step of programming the PLD to assign contacts based at least in part on the second contact assignment pattern.

11. The method as in claim 9, further comprising the steps of:

refining the second pattern of electrically conductive traces based at least in part on the second contact assignment pattern to generate a third pattern of electrically conductive traces routed from the respective contacts of the electronic component via one or more channels formed at one or more layers of the signal routing device; and determining a third contact assignment pattern for one or more contacts of the PLD based at least in part on the third pattern of electrically conductive traces.

12. The method as in claim 9, further comprising the step of programming the PLD based at least in part on the third contact assignment pattern.

13. The method as in claim 9, wherein the electronic component includes one of a group consisting of: a programmable logic device and an application specific integrated circuit (ASIC).

14. A signal routing device having one or more layers and further comprising:

an electronic component having a plurality of contacts;

a programmable logic device (PLD) having a plurality of contacts; and a plurality of electrically conductive traces connecting contacts of the PLD to respective contacts of the electronic component, the plurality of electrically conductive traces routed from the respective contacts of the electronic component via one or more channels formed at one or more layers of the signal routing device after:

determining a first pattern of electrically conductive traces routed from respective contacts of the electronic component via one or more channels formed at one or more layers of the signal routing device;

determining a first contact assignment pattern for one or more contacts of the PLD based at least in part on the first pattern of electrically conductive traces;

refining the first pattern of electrically conductive traces based at least in part on the first contact assignment pattern to generate a second pattern of electrically conductive traces routed from the respective contacts of the electronic component via one or more channels formed at one or more layers of the signal routing device; and assigning a set of one or more contacts of the PLD to one or more respective contacts of the electronic component based at least in part on the second pattern of electrically conductive traces routed from the respective contacts of the electronic component via one or more channels formed at one or more layers of the signal routing device;

wherein the one or more channels are formed by arranging vias for contacts of at least the electronic component in the signal routing device.

15. The signal routing device as in claim 14, wherein the set of one or more contacts of the PLD are assigned to the respective contacts of the electronic component by programming the PLD.

16. The signal routing device as in claim 14, wherein the electronic component includes one of a group consisting of: a programmable logic device and an application specific integrated circuit (ASIC).

17. The signal routing device as in claim 14, wherein one or more of the electrically conductive traces are routed to respective contacts of the PLD via one or more channels formed at one or more layers of the signal routing device.

* * * * *